United States Patent
Cao et al.

(10) Patent No.: US 10,847,858 B2
(45) Date of Patent: Nov. 24, 2020

(54) METHOD FOR MANUFACTURING CIRCULATORS WITH IMPROVED PERFORMANCE

(71) Applicant: Qorvo US, Inc., Greensboro, NC (US)

(72) Inventors: Yu Cao, Allen, TX (US); Yongjie Cui, Plano, TX (US); Subrahmanyam V. Pilla, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/427,143

(22) Filed: May 30, 2019

(65) Prior Publication Data
US 2020/0287262 A1 Sep. 10, 2020

Related U.S. Application Data

(60) Provisional application No. 62/815,221, filed on Mar. 7, 2019.

(51) Int. Cl.
*H01L 21/00* (2006.01)
*H01P 11/00* (2006.01)
(Continued)

(52) U.S. Cl.
CPC .......... *H01P 1/387* (2013.01); *H01L 21/8213* (2013.01); *H01L 21/8252* (2013.01); *H01L 23/66* (2013.01); *H01P 11/003* (2013.01); *H01L 2223/6627* (2013.01); *H01L 2223/6683* (2013.01)

(58) Field of Classification Search
CPC ............. H01L 21/8213; H01L 21/8252; H01L 21/02601; H01L 21/02565; H01L 21/02126; H01L 21/02603; H01L 23/66; H01L 23/4952; H01L 23/373; H01L 23/564; H01L 43/08; H01L 43/10; H01L 43/12; H01L 43/02; H01L 45/12; H01L 45/133; H01L 45/16; H01L 2223/6627;
(Continued)

(56) References Cited

U.S. PATENT DOCUMENTS 6,107,895 A * 8/2000 Butland .................. H01P 1/387
29/882
7,242,264 B1* 7/2007 How ....................... H01P 1/362
333/1.1
(Continued)

OTHER PUBLICATIONS

Zhou et al., "Design of Self-Biased Coplanar Circulator with Ferromagnetic Nanowires", 2018, Conference: 2018 IEEE Radio and Wireless Symposium (RWS), Jan. 2018 (Year: 2018).*
(Continued)

*Primary Examiner* — Nikolay K Yushin
(74) *Attorney, Agent, or Firm* — Withrow & Terranova, P.L.L.C.

(57) ABSTRACT

A method for manufacturing a self-biased circulator includes cooling a nanocomposite material to a magnetization temperature below 200 K, applying an external magnetic field to the nanocomposite material to form a magnetic nanocomposite material, providing the magnetic nanocomposite material in a semiconductor substrate, and providing one or more metal layers over the magnetic nanocomposite material to form a circulator. By cooling and then magnetizing the nanocomposite material, a performance of the circulator may be significantly improved.

22 Claims, 5 Drawing Sheets (51) Int. Cl.
　　　*H01P 1/387*　　　(2006.01)
　　　*H01L 23/66*　　　(2006.01)
　　　*H01L 21/8252*　　(2006.01)
　　　*H01L 21/82*　　　(2006.01)

(58) Field of Classification Search
　　　CPC . H01L 2223/6683; B82Y 10/00; B82Y 40/00;
　　　　　　　　　　　　　　　　　　H01P 1/387; H01P 11/003
　　　See application file for complete search history.

(56) References Cited

U.S. PATENT DOCUMENTS

| | | | | |
|---|---|---|---|---|
| 8,400,237 | B2* | 3/2013 | Ueno | H01L 21/312 |
| | | | | 333/238 |
| 9,367,783 | B2* | 6/2016 | Fullerton | G01D 18/00 |
| 9,818,514 | B2* | 11/2017 | Arnold | H01F 10/007 |
| 10,096,879 | B2* | 10/2018 | Rajendran | H01P 1/383 |
| 10,553,782 | B2* | 2/2020 | Ketterson | H01P 1/38 |
| 2004/0151978 | A1* | 8/2004 | Huang | B82Y 25/00 |
| | | | | 429/83 |
| 2010/0237967 | A1* | 9/2010 | Ueno | H01L 21/312 |
| | | | | 333/246 |
| 2016/0172085 | A1* | 6/2016 | Arnold | H01F 10/007 |
| | | | | 438/3 |
| 2017/0256836 | A1* | 9/2017 | Rajendran | H01F 7/021 |
| 2018/0240963 | A1* | 8/2018 | Ketterson | H04B 7/02 |

OTHER PUBLICATIONS

Barrera et al., "Magnetic Properties of Nanocomposites", 2019, Applied Sciences, 9, 212, pp. 2-28, Jan. 9, 2019. (Year: 2019).*

* cited by examiner

METHOD FOR MANUFACTURING CIRCULATORS WITH IMPROVED PERFORMANCE

RELATED APPLICATIONS

This application claims the benefit of provisional patent application Ser. No. 62/815,221, filed Mar. 7, 2019, the disclosure of which is hereby incorporated herein by reference in its entirety.

GOVERNMENT SUPPORT

This invention was made with government support under W911 NF-17-C-0033 awarded by DARPA MTO. The government has certain rights in the invention.

FIELD OF THE DISCLOSURE

The present disclosure is related to circulators, and in particular to methods for manufacturing circulators having improved performance.

BACKGROUND

Monolithic microwave integrated circuits (MMICs) provide a compact front-end solution for transmit/receive modules in radar and radio frequency (RF) communications systems. Duplexers like RF switches and/or a circulator allow a transmitter and receiver to share the same antenna. Compared to RF switches, circulators enable transmitting and receiving signals simultaneously. This full-duplex functionality is highly desirable due to the doubling of bandwidth it provides. However, conventional circulators are typically required to be off-chip since they require a bulky permanent magnet mounted in a board or package. This greatly increases the size the transmit/receive module in which the conventional circulator is provided. Efforts have been made to replace the permanent magnet of circulators with much smaller "self-biased" magnetic structures. However, the performance of these self-biased circulators has thus far been quite poor. In particular, insertion loss, which is a key performance parameter of a circulator, is very high for self-biased circulators. Accordingly, there is a need for self-biased circulators with improved performance and methods for manufacturing the same.

SUMMARY

A method for manufacturing a self-biased circulator includes cooling a nanocomposite material to a magnetization temperature below 200 K, applying an external magnetic field to the nanocomposite material to form a magnetic nanocomposite material, providing the magnetic nanocomposite material in a semiconductor substrate, and providing one or more metal layers over the magnetic nanocomposite material to form a circulator. By cooling and then magnetizing the nanocomposite material, a performance of the circulator may be significantly improved.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1A:
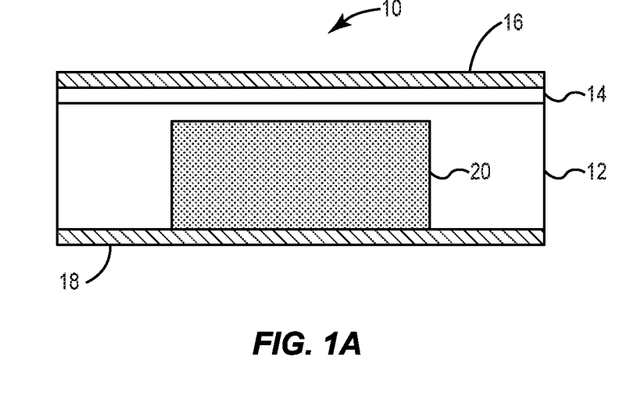
FIGS. 1A and 1B show a self-biased circulator according to one embodiment of the present disclosure.
Figure 1B:
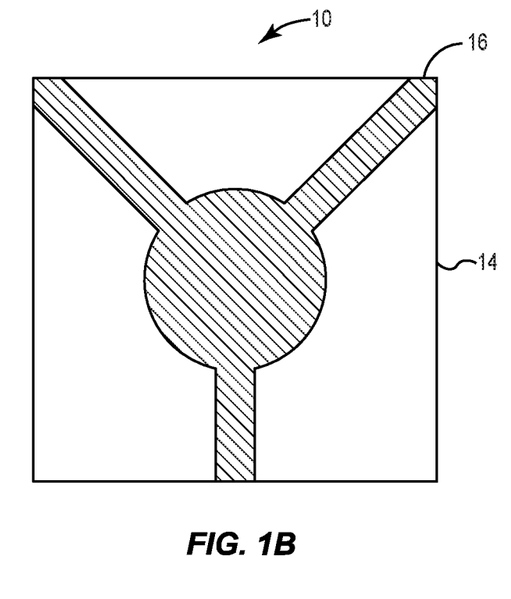

FIGS. 1A and 1B illustrate a self-biased circulator 10 according to one embodiment of the present disclosure. The self-biased circulator 10 includes a substrate 12, a semiconductor device layer 14 on the substrate 12, a first metal layer 16 on the semiconductor device layer 14 opposite the substrate 12, a second metal layer 18 on the substrate 12 opposite the semiconductor device layer 14, and a magnetic nanocomposite material 20 in the substrate 12. As shown, a portion of the substrate 12 and the semiconductor device layer 14 are located between the first metal layer 16 and the magnetic nanocomposite material 20. The second metal layer 18 is in contact with the magnetic nanocomposite material 20. FIG. 1B shows a top-down view of the self-biased circulator 10. FIG. 1B shows that the first metal layer 16 is patterned into a stripline Y-junction over the magnetic nanocomposite material 20. The second metal layer 18 may be provided as a ground plane. Due to a low-temperature magnetization process of the magnetic nanocomposite material 20 discussed below, the insertion loss of the self-biased circulator 10 may be significantly improved when compared to self-biased circulators magnetized at room temperature.

The substrate 12 may be a semiconductor substrate. In one embodiment, the substrate 12 comprises silicon carbide (SiC). The semiconductor device layer 14 may be any suitable insulating or semi-insulating semiconductor material. In one embodiment, the semiconductor device layer 14 comprises gallium nitride (GaN). Notably, only the portion of the substrate 12 and the semiconductor device layer 14 in which the self-biased circulator 10 is formed are shown in FIGS. 1A and 1B. The substrate 12 and the semiconductor device layer 14 may be part of a semiconductor chip that provides a monolithic microwave integrated circuit (MMIC) such that the self-biased circulator 10 is integrated on the same semiconductor chip as the MMIC. This may significantly reduce the size of a resulting transmit/receive module incorporating the MMIC. The first metal layer 16 and the second metal layer 18 may comprise any suitable metals. While a particular pattern is shown for the stripline Y-junction in FIG. 1B, those skilled in the art will readily appreciate that any number of suitable patterns for providing the first metal layer 16 to form a circulator exist, all of which are contemplated herein. While a portion of the substrate 12 and the semiconductor device layer 14 are shown between the first metal layer 16 and the magnetic nanocomposite material 20, more or fewer layers may be located between the first metal layer 16 and the magnetic nanocomposite material 20 without departing from the principles of the present disclosure. In one embodiment, the magnetic nanocomposite material 20 comprises anodized aluminum oxide (AAO) that has been electroplated with nanowires and magnetized according to the processes described herein. The nanowires may comprise an iron-nickel alloy (FeNi) and/or an iron-cobalt alloy (FeCo).

Figure 2:
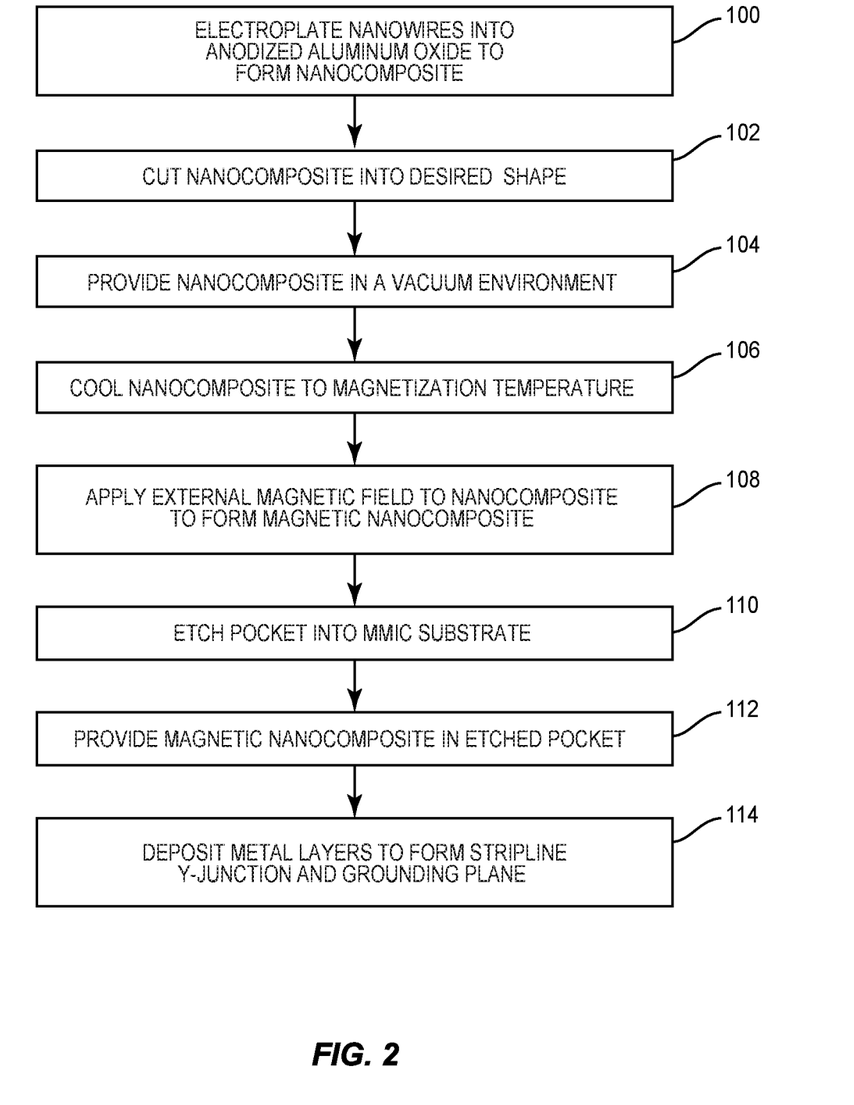
FIG. 2 is a flow diagram illustrating a method for manufacturing a self-biased circulator according to one embodiment of the present disclosure.

FIG. 2 is a flow diagram illustrating a method for manufacturing a self-biased circulator according to one embodiment of the present disclosure. First, nanowires are electroplated into AAO to form a nanocomposite material with nanowires (step 100). The nanocomposite material is then cut into a desired shape (step 102). In one embodiment, the nanocomposite material is cut into a disk having a diameter between 3.0 mm and 8.0 mm. However, the nanocomposite material may be cut into any suitable shape and/or size without departing from the principles of the present disclosure. The nanocomposite material may be cut via a laser cutting process. The nanocomposite material is then optionally provided in a vacuum environment (step 104). Providing the nanocomposite material in a vacuum environment may avoid moisture condensation in the following steps. The nanocomposite material is then cooled to a magnetization temperature (step 106). In various embodiments, the magnetization temperature is less than 200 K, more preferably less than 100 K, more preferably less than 50 K, more preferably less than 10 K, and most preferably less than 5 K. In one exemplary embodiment, the magnetization temperature is 4.2 K. Cooling the nanocomposite material to the magnetization temperature suppresses phonon modes such that lattice vibrations are reduced to a very low level. This makes the following magnetization steps much more efficient so that the magnetic domains in the nanocomposite material can be better aligned with reduced dispersion and demagnetization. Accordingly, the performance of the resulting self-biased circulator is greatly improved.

An external magnetic field higher than the nanocomposite's magnetic saturation field is then applied to the nanocomposite material (step 108). The external magnetic field may have a strength greater than 1.0 T, greater than 1.5 T, and greater than 2.0 T in various embodiments. This provides a magnetic nanocomposite material with a high quality. A pocket is then etched into a MMIC substrate (step 110). This may be accomplished with standard semiconductor manufacturing techniques known in the art. As shown in FIG. 1A, the pocket is etched into a backside of the substrate. The pocket may be etched such that a portion of the substrate is left between a bottom of the pocket and a top surface of the substrate and/or such that all or a portion of a semiconductor device layer is left between a bottom of the pocket and a top surface of the substrate. The magnetic nanocomposite material is then provided in the pocket (step 112). Finally, metal layers are deposited on the substrate to form a stripline Y-junction and a grounding plane to provide a self-biased circulator (step 114).

As discussed above, manufacturing a self-biased circulator in this manner results in significantly improved performance. Comparing a self-biased circulator provided using all of the above steps (referred to as the "improved self-biased circulator) and one provided without steps 104-108 (referred to as the "standard self-biased circulator"), when these self-biased circulators operate at 5.7 GHz, the improved self-biased circulator experiences 0.5 dB less insertion loss (e.g., 2.8 dB vs. 3.3 dB). The improved self-biased circulator provides 8.4 dB of isolation while the standard self-biased circulator provides 8.3 dB. The improved self-biased circulator provides 15.8 dB return loss while the standard self-biased circulator provides 14.5 dB.

Notably, while the above is discussed primarily with respect to nanocomposite materials, the principles for low-temperature magnetization discussed herein may also provide significant performance benefits when used on other self-biased materials such as ferrites and the like. That is, the method discussed above with respect to FIG. 2 is not limited in application to nanocomposite materials but also may be performed on ferrites and other self-biased materials to obtain similar performance benefits.

Figure 3A:
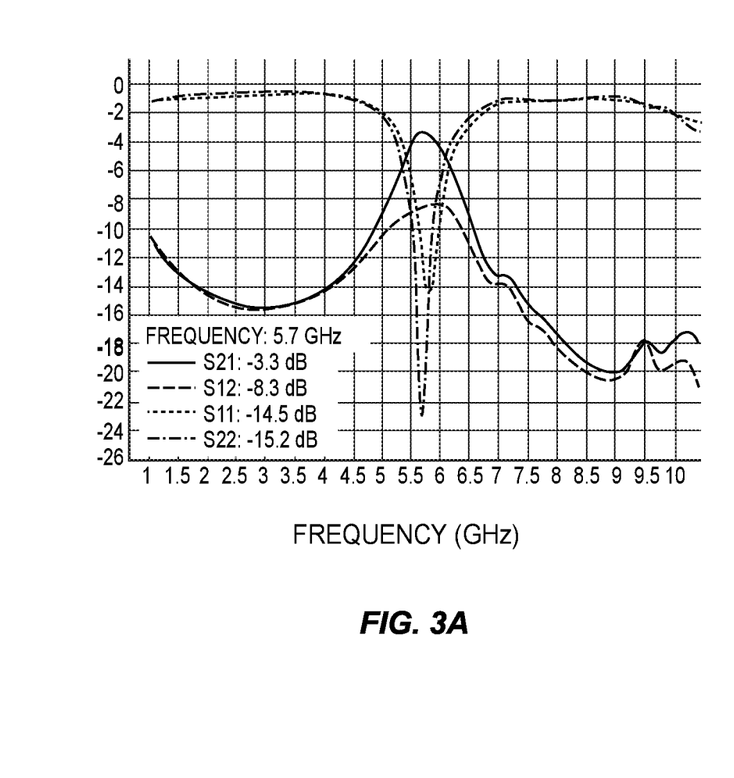
FIGS. 3A and 3B are graphs illustrating a performance of a self-biased circulator according to one embodiment of the present disclosure.
Figure 3B:
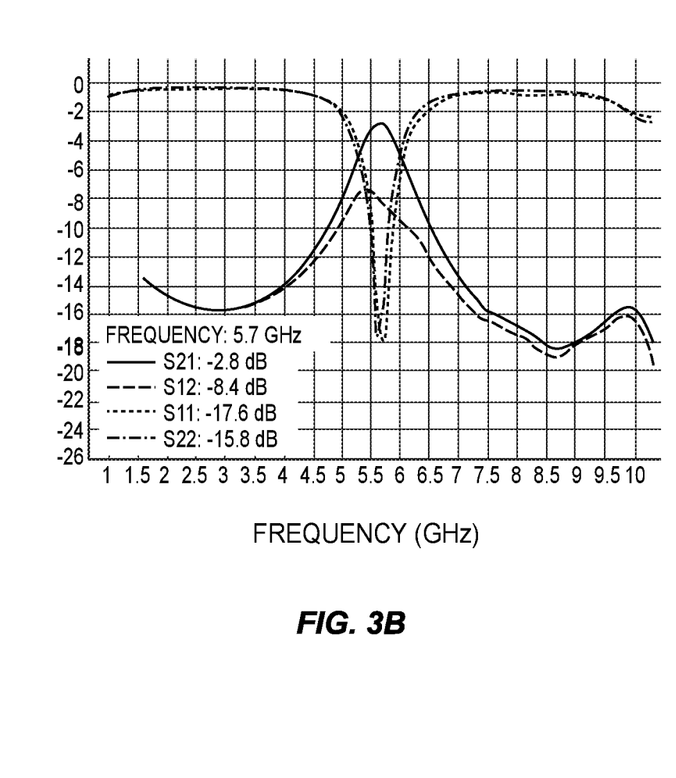

FIGS. 3A and 3B are graphs illustrating a performance of the improved self-biased circulator vs the standard self-biased circulator. In particular, FIG. 3A is a graph illustrating S-parameters for the standard self-biased circulator while FIG. 3B is a graph illustrating S-parameters for the improved self-biased circulator. As shown, the performance of the improved self-biased circulator is better than that of the standard self-biased circulator.

Figure 4:
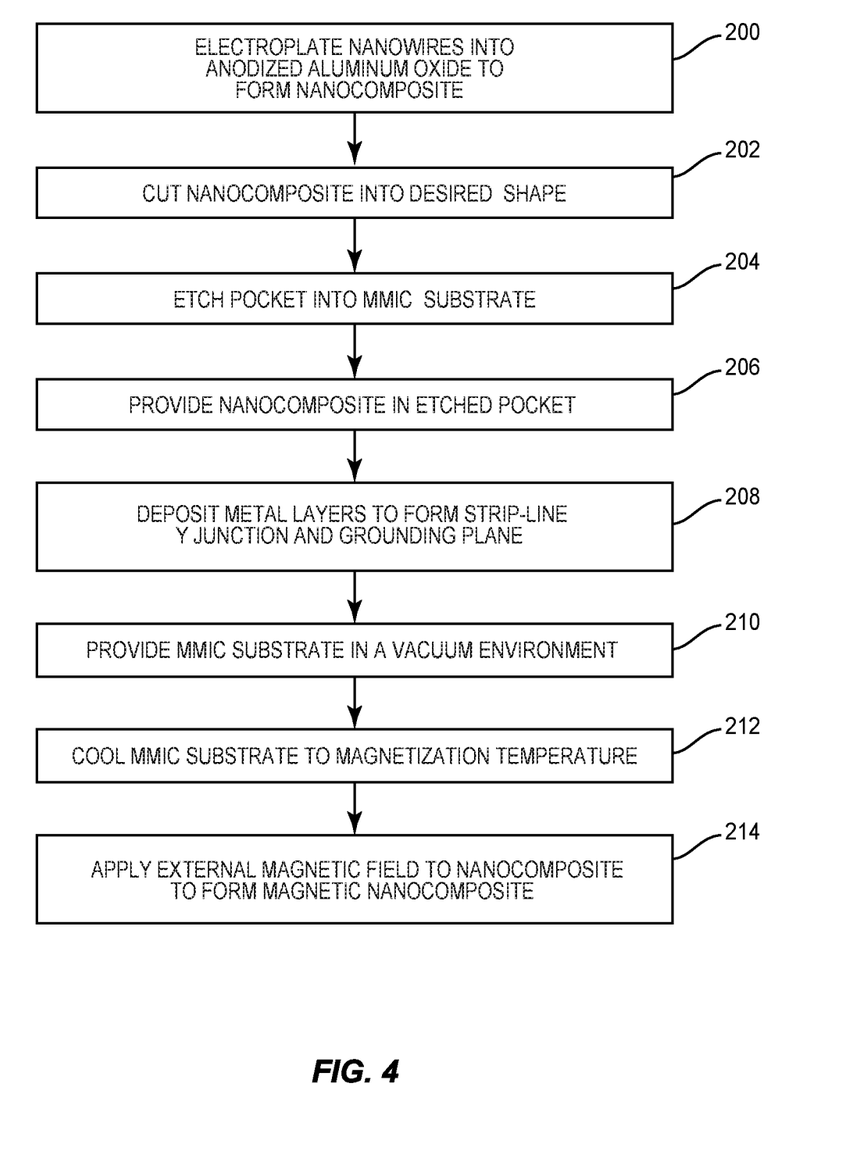
FIG. 4 is a flow diagram illustrating a method for manufacturing a self-biased circulator according to one embodiment of the present disclosure.

FIG. 4 is a flow diagram illustrating a method for manufacturing a self-biased circulator according to an additional embodiment of the present disclosure. First, nanowires are electroplated into AAO to form a nanocomposite material with nanowires (step 200). The nanocomposite material is then cut into a desired shape (step 202). In one embodiment, the nanocomposite material is cut into a disk having a diameter between 3.0 mm and 8.0 mm. However, the nanocomposite material may be cut into any suitable shape and/or size without departing from the principles of the present disclosure. The nanocomposite material may be cut via a laser cutting process. A pocket is then etched into a MMIC substrate (step 204). This may be accomplished with standard semiconductor manufacturing techniques. As shown in FIG. 1A, the pocket is etched into a backside of the substrate. The pocket may be etched such that a portion of the substrate is left between a bottom of the pocket and a top surface of the substrate and/or such that all or a portion of a semiconductor device layer is left between a bottom of the pocket and a top surface of the substrate. The nanocomposite material is then provided in the pocket (step 206). One or more metal layers are deposited on the substrate to form a stripline Y-junction and a grounding plane to provide a self-biased circulator (step 208).

The MMIC substrate is then optionally provided in a vacuum environment (step 210). Providing the MMIC substrate in a vacuum environment may avoid moisture condensation in the following steps. The MMIC substrate is then cooled to a magnetization temperature (step 212). In various embodiments, the magnetization temperature is less than 200 K, more preferably less than 100 K, more preferably less than 50 K, more preferably less than 10 K, and most preferably less than 5 K. In one exemplary embodiment, the magnetization temperature is 4.2 K. Cooling the MMIC substrate to the magnetization temperature suppresses phonon modes in the nanocomposite material such that lattice vibrations are reduced to a very low level. This makes the following magnetization steps much more efficient so that the magnetic domains in the nanocomposite material can be better aligned with reduced dispersion and demagnetization. Accordingly, the performance of the self-biased circulator is greatly improved. An external magnetic field is then applied to the MMIC substrate (step 214). The external magnetic field higher than the nanocomposite's magnetic saturation filed may have a strength greater than 1.0 T, greater than 1.5 T, and greater than 2.0 T in various embodiments. This provides a magnetic nanocomposite material with a high quality.

Notably, the process described in FIG. 4 is substantially similar to that in FIG. 2, except that the nanocomposite material is provided in the MMIC substrate before the cooling and magnetization process rather than after. As discussed above, manufacturing a self-biased circulator results in significantly improved performance. The performance improvements in the self-biased circulator from the process described with respect to FIG. 4 may be different than the self-biased circulator from the process described with respect to FIG. 2. Comparing a self-biased circulator provided using all of the above steps (referred to as the "improved self-biased circulator") and one provided without steps 210-214 (referred to as the "standard self-biased circulator"), when these self-biased circulators operate at 9.7 GHz and 8.9 GHz, respectively, the improved self-biased circulator provides 4.4 dB of insertion loss while the standard self-biased circulator provides 6.2 dB of insertion loss. The improved self-biased circulator provides 5.8 dB of isolation while the standard self-biased circulator provides 7.2 dB of isolation. The improved self-biased circulator provides greater than 11 dB of return loss while the standard self-biased circulator provides greater than 10 dB of return loss.

Figure 5A:
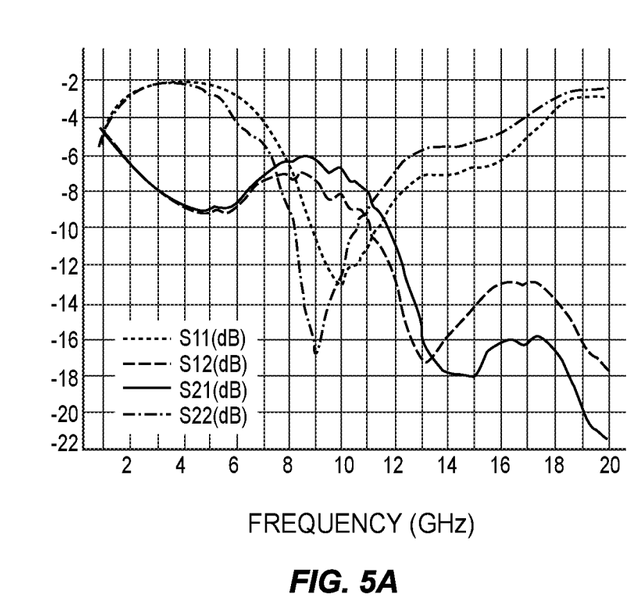
FIGS. 5A and 5B are graphs illustrating a performance of a self-biased circulator according to one embodiment of the present disclosure.
Figure 5B:
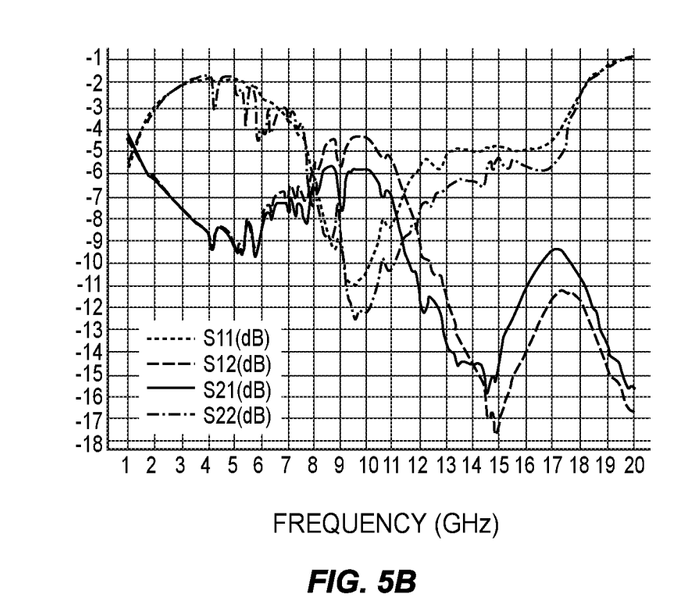

FIGS. 5A and 5B are graphs illustrating a performance of the improved self-biased circulator vs the standard self-biased circulator. In particular, FIG. 5A is a graph illustrating S-parameters for the standard self-biased circulator while FIG. 5B is a graph illustrating S-parameters for the improved self-biased circulator. The reverse of the S12 and S21 curves from FIG. 5A to FIG. 5B was caused by a reversal of the magnetization field during the cooling and magnetization process of the improved self-biased circulator. The circulation frequency drift in the improved self-biased circulator may be caused by thermal shrinking and expansion of the nanocomposite material during the cooling and magnetization process.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
    cooling a self-biased material to a magnetization temperature below 200 K;
    applying an external magnetic field to the self-biased material to form a magnetic self-biased material;
    providing the magnetic self-biased material in a semiconductor substrate; and
    providing one or more metal layers over the magnetic self-biased material to form a circulator.

2. The method of claim 1 wherein the self-biased material is a nanocomposite material comprising a plurality of nanowires.

3. The method of claim 2 wherein the nanocomposite material is anodized aluminum oxide (AAO) that has been electroplated to form the plurality of nanowires.

4. The method of claim 3 wherein the plurality of nanowires comprise one of an iron-nickel alloy (FeNi) and an iron-cobalt alloy (FeCo).

5. The method of claim 2 wherein the external magnetic field has a strength greater than 1.0 Tesla.

6. The method of claim 5 wherein the external magnetic field has a strength greater than 2.0 Tesla.

7. The method of claim 2 wherein the semiconductor substrate provides a monolithic microwave integrated circuit (MMIC).

8. The method of claim 7 wherein providing the nanocomposite material in the semiconductor substrate comprises:
etching a pocket in the semiconductor substrate; and
providing the nanocomposite material in the pocket.

9. The method of claim 2 wherein providing the nanocomposite material in the semiconductor substrate comprises:
etching a pocket in the semiconductor substrate; and
providing the nanocomposite material in the pocket.

10. The method of claim 2 wherein the circulator is a radio frequency (RF) circulator.

11. The method of claim 2 wherein the magnetization temperature is less than 100 K.

12. The method of claim 11 wherein the magnetization temperature is less than 50 K.

13. The method of claim 12 wherein the magnetization temperature is less than 10 K.

14. The method of claim 13 wherein the magnetization temperature is less than 5 K.

15. The method of claim 2 wherein the one or more metal layers form a stripline Y-junction over the nanocomposite material.

16. The method of claim 15 wherein the one or more metal layers form a grounding plane opposite the stripline Y-junction.

17. The method of claim 16 wherein the nanocomposite material is provided in the semiconductor substrate such that:
the grounding plane is on the nanocomposite material; and
a layer of semiconductor material is provided between the nanocomposite material and the stripline Y-junction.

18. The method of claim 17 wherein the nanocomposite material is anodized aluminum oxide (AAO) that has been electroplated to form the plurality of nanowires.

19. The method of claim 18 wherein the plurality of nanowires comprise one of an iron-nickel alloy (FeNi) and an iron-cobalt alloy (FeCo).

20. The method of claim 19 wherein the semiconductor substrate comprises a first semiconductor material and the layer of semiconductor material comprises a second semiconductor material.

21. The method of claim 20 wherein the semiconductor substrate comprises silicon carbide (SiC) and the layer of semiconductor material comprises gallium nitride (GaN).

22. The method of claim 21 wherein the semiconductor substrate provides a monolithic microwave integrated circuit (MMIC).

* * * * *